United States Patent [19]

Nakamura et al.

[11] Patent Number: 5,366,522
[45] Date of Patent: Nov. 22, 1994

[54] POLYCRYSTALLINE DIAMOND CUTTING TOOL AND METHOD OF MANUFACTURING THE SAME

[75] Inventors: Tsutomu Nakamura; Yasuyuki Kanada; Tetsuo Nakai, all of Hyogo, Japan

[73] Assignee: Sumitomo Electric Industries, Ltd., Osaka, Japan

[21] Appl. No.: 970,798

[22] Filed: Nov. 3, 1992

[30] Foreign Application Priority Data

Nov. 7, 1991 [JP] Japan .................. 3-291629
Aug. 31, 1992 [JP] Japan .................. 4-232027

[51] Int. Cl.$^5$ .............................. B24D 3/00
[52] U.S. Cl. ............................ 51/293; 51/295; 51/309; 428/699
[58] Field of Search .......... 51/293, 295, 298, 309; 428/699

[56] References Cited

U.S. PATENT DOCUMENTS

| | | | |
|---|---|---|---|
| 4,919,974 | 4/1990 | McCune et al. | 51/293 |
| 5,173,089 | 12/1992 | Tanabe et al. | 51/293 |
| 5,178,645 | 1/1993 | Nakamura et al. | 51/293 |

FOREIGN PATENT DOCUMENTS

| | | | |
|---|---|---|---|
| 0166708 | 1/1986 | European Pat. Off. | C23C 16/26 |
| 52-12126 | 4/1977 | Japan . | |
| 53-114589 | 10/1978 | Japan . | |
| 59-161268 | 9/1984 | Japan . | |
| 61-33865 | 2/1986 | Japan . | |
| 1-212767 | 8/1989 | Japan . | |
| 4-146007 | 5/1992 | Japan . | B23B 27/20 |
| 4-193406 | 7/1992 | Japan . | B23B 27/20 |

*Primary Examiner*—David Brunsman
*Assistant Examiner*—Deborah Jones
*Attorney, Agent, or Firm*—W. G. Fasse; W. F. Fasse

[57] ABSTRACT

A polycrystalline diamond cutting tool comprises a tool material of polycrystalline diamond formed by low-pressure vapor deposition, which is bonded to a shank of cemented carbide through a brazing layer. The thickness of the polycrystalline diamond layer is set at 0.1 to 1.0 mm, while that of the brazing layer is set at 10 to 50 μm. The brazing layer is made of a material having a melting point of 950° to 1300° C., which is in the form of an alloy layer containing at least one material selected from metals belonging to the groups IVa, Va, VIa and VIIa of the periodic table and carbides thereof and at least one material selected from Au, Ag, Cu, Pt, Pd and Ni. The polycrystalline diamond cutting tool is improved in heat resistance and tool strength. In order to improve deposition resistance of the cutting tool, the surface roughness of a tool rake face is set to be not more than 0.2 μm in Rmax. A portion of the polycrystalline diamond layer up to a depth of 10 μm from the rake face contains 99 to 100 atomic percent of carbon elements, and 99 to 100% of carbon atoms are diamond-bonded. A surface of the polycrystalline diamond layer which has been in contact with the substrate during formation of the polycrystalline diamond layer defines the rake face, whose surface is subjected to ion beam machining and thereafter treated in the atmosphere at a temperature of 300° to 500° C.

39 Claims, 2 Drawing Sheets

POLYCRYSTALLINE DIAMOND CUTTING TOOL AND METHOD OF MANUFACTURING THE SAME

FIELD OF THE INVENTION

The present invention relates to a bonding structure of a polycrystalline diamond cutting tool which has a high strength and an excellent heat resistance, and a method of manufacturing the same. It also relates to a polycrystalline diamond cutting tool which has an excellent deposition resistance and a method of manufacturing the same.

BACKGROUND OF THE INVENTION

Diamond, which is excellent in hardness and thermal conductivity, exhibits high performance upon application to a cutting tool or a wear resistant tool, and is employed for various purposes. For example, Japanese Patent Publication No. 52-12126 (1977) describes a diamond cutting tool employing a diamond sintered body, which is prepared by sintering fine grains of diamond with a ferrous metal binder in order to suppress a defect caused by cleavage, which is a disadvantage of monocrystalline diamond, in particular.

However, such a tool employing a diamond sintered body has a low heat resistance which is a problem. In more concrete terms, the tool may deteriorate in wear resistance and strength when the temperature of its cutting edge is increased and lose practicability. For example, the diamond sintered body is reduced in wear resistance and strength when the same is heated to a temperature exceeding 750° C., and broken when the same is further heated to a temperature exceeding 900° C. This is conceivably due to graphitization of the diamond caused at interfaces between the diamond grains and the ferrous metal binder, and a high thermal stress is generated due to the difference in thermal expansion coefficients between the diamond grains and the metal binder under a high temperature.

In order to improve the heat resistance, there has been developed another tool employing a diamond sintered body, as described in Japanese Patent Laying-Open No. 53-114589 (1978), for example. According to this prior art, an acid treatment is performed on the sintered body to remove most portions of a binder metal layer. In this technique, however, the tool is remarkably reduced in strength due to holes caused by the removed portions of the binder metal layer, although the heat resistance is improved.

Japanese Patent Laying-Open No. 59-161268 (1984) or 61-33865 (1986), for example, discloses a tool employing a heat-resistant diamond sintered body not containing any holes, in order to solve the aforementioned problem. Such a heat-resistant diamond sintered body contains a binder of Si, SiC or an Ni-Si alloy. However, this sintered body is insufficient in wear resistance due to a small degree of cohesion between the diamond grains and a large content of the binder. Thus, no satisfactory performance has generally been attained in relation to wear resistance and strength of a diamond tool, in spite of the improvement in heat resistance.

Under such circumstances, there has been developed a cutting tool employing polycrystalline diamond which is synthesized by low-pressure vapor deposition which does not contain any binder, as described in Japanese Patent Laying-Open No. 1-212767 (1989), for example, in order to solve problems in a diamond tool employing a diamond sintered body.

In a cutting tool employing a tool material of polycrystalline diamond, a polycrystalline diamond layer is bonded to a tool holder so that a cutting edge is formed on this polycrystalline diamond layer. In connection with such a cutting tool which is prepared by brazing a tool material of polycrystalline diamond with a tool holder, however, the inventors have found that not only the performance of the tool material itself but that of a brazing layer for bonding the tool material to the tool holder are factors controlling the performance of the tool. The inventors have also found that the heat resistance and the thickness of the brazing layer remarkably influence the tool performance in addition to the thickness of the polycrystalline diamond layer, particularly when the polycrystalline diamond layer is not more than 0.5 mm in thickness.

In other words, the strength of the tool is lowered as the thickness of the polycrystalline diamond layer is reduced, although the polycrystalline diamond layer is preferably minimized in thickness in view of the production cost. Even if the thickness of the polycrystalline diamond layer exerts no influence on the tool strength, the brazing layer may be remarkably deformed particularly when the cutting edge is heated to a high temperature if the brazing layer has an inferior heat resistance or an excessive thickness, whereby the strength of the overall tool is reduced.

On the other hand, polycrystalline diamond which is synthesized by low-pressure vapor deposition has an excellent strength, wear resistance and heat resistance since the same is substantially formed only of diamond, and is regarded as an ideal material for a diamond tool.

In a cutting tool made of a polycrystalline diamond material which is synthesized by low-pressure vapor deposition, however, a work piece particles may be deposited on the tool depending on cutting conditions, leading to a problem of an insufficient work surface roughness.

SUMMARY OF THE INVENTION

It is an object of the present invention to provide a polycrystalline diamond cutting tool which has a superior heat resistance and a higher strength than a conventional tool, and to provide a method of manufacturing such a tool.

Another object of the present invention is to provide a polycrystalline diamond cutting tool which has a superior deposition resistance compared to a conventional tool, and a method of manufacturing the tool.

A polycrystalline diamond cutting tool according to the present invention comprises a tool material of a polycrystalline diamond layer, synthesized by low-pressure vapor deposition, which bonded to a tool holder with interposition of a brazing layer. The polycrystalline diamond layer forming the tool material has a thickness of at least 0.1 mm and not more than 1.0 mm. Preferably, the brazing layer is formed with a thickness of 10 to 50 μm. The tool material is bonded to the tool holder by a brazing filler metal which has a melting point of at least 950° C. and not more than 1300° C. The thickness of the polycrystalline diamond layer is defined by that of a layer vertically formed on a substrate surface.

A method of manufacturing a polycrystalline diamond cutting tool according to the present invention has the following steps. First, a polycrystalline diamond layer is formed on a substrate by low-pressure vapor deposition. Then, the substrate is removed and the polycrystalline diamond layer is cut into a prescribed material shape, to form tool tips or members. Then, a brazing filler metal is interposed between a bonding surface of the tool member and a tool material receiving surface of a tool holder to be heated and melted, thereby bonding the tool member to the tool holder. The brazing filler metal is prepared as an alloy layer containing at least one metal selected from those belonging to the groups IVa, Va, VIa and VIIa of the periodic table, i.e., Ti, Zr, Hf, V, Nb, Ta, Cr, Mo, W, Mn, Tc and Re, and at least one metal selected from Au, Ag, Cu, Pt, Pd and Ni.

A method of manufacturing a polycrystalline diamond cutting tool according to another aspect of the present invention comprises the following steps. First, a polycrystalline diamond layer is formed on a substrate by low-pressure vapor deposition. Then, the substrate is removed, and the polycrystalline diamond layer is cut into a prescribed tool tip shape. Then, an upper growth surface of the polycrystalline diamond layer forming the tool material is covered with a cover layer made of at least one material selected from metals belonging to the groups IVa, Va, VIa and VIIa of the periodic table and metal carbides thereof. A brazing filler metal containing at least one material selected from a group of Au, Ag, Cu, Pt, Pd and Ni is interposed between a bonding surface of the tool tip or member provided with the covering layer and a material receiving surface of a tool holder. Such assembly is then heated and the filler is melted, thereby bonding the tool material to the tool holder.

From the results of various investigations, the inventors have found that the characteristics of the polycrystalline diamond layer itself and those of the brazing filler metal are factors influencing and controlling the strength and heat resistance of the polycrystalline diamond cutting tool. Consequently, it has been found that the thickness of the polycrystalline diamond layer forming the tool material is preferably in a range of 0.1 to 1.0 mm. A large thickness is unpreferable in view of the working efficiency of the tool material. If the thickness is smaller than 0.1 mm, the strength of the tool material is reduced.

On the other hand, influential characteristics of the brazing filler metal are the material and the thickness thereof. According to the present invention, the brazing filler metal, having a melting point of 950° to 1300° C., still has a sufficient heat resistance under high temperature cutting conditions. When the thickness of the brazing filler metal is preferably in a range of 10 to 50 μm, it is possible to suppress a reduction in the tool strength caused by deformation of the brazing filler metal.

In order to attain the object of improving a deposition resistance, the inventors have analyzed the causes for deposition of work piece particles on the tool when work pieces are cut with the polycrystalline diamond tool disclosed in Japanese Patent Laying-Open No. 1-212767 (1989). As the result, it has been found that work piece particles of an aluminum alloy or the like are deposited when the tool contains impurities, such as the substrate material and carbides of elements forming the substrate material contained in a tool rake face, i.e., a surface of the polycrystalline diamond layer that has been in contact with the substrate during synthesis, and non-diamond carbon which is co-grown in an initial stage of film formation by low-pressure vapor deposition in excess of constant amounts. It has also been found that the physical surface roughness of the tool rake face also influences the deposition resistance.

In order to remove such factors, a diamond grindstone or the like may be employed to grind the tool rake face, thereby removing the impurities, other than diamond, from portions close to the tool rake face. In such a method, however, a load is applied to the polycrystalline diamond layer by the grinding operation, whereby the polycrystalline diamond substance is cracked during the operation. In such a method, further, it is difficult to control the thickness of a portion removed from the polycrystalline diamond layer. When the thickness of the removed portion is too large, the tool rake face is defined by a portion containing coarse polycrystalline diamond grains which to reduce the strength of the polycrystalline diamond tool. According to such method, in addition, the manufacturing cost is increased in consideration of wear-out of the high-priced diamond grindstone which is employed for the grinding operation.

In consideration of the aforementioned points, the present invention has been proposed on the basis of the discovery that it is possible to implement a polycrystalline diamond cutting tool which has an excellent deposition resistance when impurities other than diamond are accurately removed from a portion of a polycrystalline diamond layer to a desired thickness with no damage to the polycrystalline diamond layer by combining an ion beam machining and a heat treatment.

A polycrystalline diamond cutting tool according to another aspect of the present invention comprises a tool material, formed by a polycrystalline diamond layer synthesized by low-pressure vapor deposition, which is bonded to a tool holder. A tool rake face of this tool has a surface roughness of not more than 0.2 μm measured as maximum height Rmax. The crystal grain sizes of the polycrystalline diamond layer are at least of 0.01 μm and not more than 1 μm on the tool rake face side, and an least 5% and not more than 15% of the thickness of the polycrystalline diamond layer on the side of a surface bonded to the tool holder. A portion of the polycrystalline diamond layer up to a depth of 10 μm from the tool rake face is composed at least of 99 atomic percent and not more than 100 atomic percent of carbon elements and at least 0 atomic percent and not more than 1 atomic percent of elements other than carbon, while at least 99% and not more than 100% of the contained carbon atoms are diamond-bonded.

Preferably, the tool material is bonded to the tool holder by a brazing filler metal having a melting point in a range of at least 950° C. and not more than 1300° C. The thickness of the polycrystalline diamond layer is at least 0.1 mm and not more than 1.0 mm.

In a method of manufacturing a polycrystalline diamond cutting tool according to still another aspect of the present invention, a polycrystalline diamond layer is first formed on a substrate containing a metal and/or an alloy, by low-pressure vapor deposition. The substrate is removed from the polycrystalline diamond layer, so that only the polycrystalline diamond layer is recovered. Ion beam machining is performed on a surface of the polycrystalline diamond layer which has been in contact with the substrate during formation thereof, and then the polycrystalline diamond layer is heated in the normal atmosphere at a temperature in a range of at least 300° C. and not more than 500° C. Thereafter a tool tip or member of a prescribed shape is formed of the polycrystalline diamond layer. The tool material is bonded to a tool holder so that the surface subjected to ion beam machining defines a tool rake face. A cutting edge is formed on the tool material while maintaining the surface state of the tool rake face.

In a method of manufacturing a polycrystalline diamond cutting tool according to a further aspect of the present invention, a polycrystalline diamond layer is first formed on a substrate containing a metal and/or an alloy, by low-pressure vapor deposition. The substrate is removed from the polycrystalline diamond layer, so that a tool member having a prescribed shape is formed of the polycrystalline diamond layer. The tool member is bonded to a tool holder, so that a surface of the polycrystalline diamond layer which has been in contact with the substrate during formation thereof defines a tool rake face. Ion beam machining is performed on the tool rake face, and the thereafter the tool material is heated in the normal atmosphere at a temperature in a range of at least 300° C. and not more than 500° C. After the ion beam machining and the heat treatment, a cutting edge is formed on the tool material while maintaining the surface state of the tool rake face.

In a method of manufacturing a polycrystalline diamond cutting tool according to a further aspect of the present invention, a polycrystalline diamond layer is first formed on a substrate containing a metal and/or an alloy by low-pressure vapor deposition. The substrate is removed from the polycrystalline diamond layer, and a tip or member having a prescribed shape is formed of the polycrystalline diamond layer. The tool member is bonded to a tool holder so that a surface of the polycrystalline diamond layer which has been in contact with the substrate during formation thereof, defines a tool rake face. A cutting edge is formed on the tool material while maintaining the surface state of the tool rake face. Ion beam machining is performed on the tool rake face of the tool material provided with the cutting edge, and thereafter the tool material is heated in the normal atmosphere at a temperature in a range of at least 300° C. and not more than 500° C.

According to a preferred manufacturing method of the present invention, a polycrystalline diamond layer having a thickness of at least 0.1 mm and not more than 1.0 mm is formed on a substrate by low-pressure vapor deposition. Then, the tool material is bonded to a tool holder through a brazing filler metal having a melting point in a range of at least 950° C. and not more than 1300° C. The substrate contains at least one element selected from Si, Mo, W, and the surface roughness of its surface provided with the polycrystalline diamond layer is not more than 0.2 μm measured as maximum height Rmax. An ion source employed for ion beam machining is oxygen. The thickness of a portion of the polycrystalline diamond layer removed by the ion beam machining is preferably in a range of at least 0.02 μm and not more than 2 μm from the surface.

In the polycrystalline diamond cutting tool according to the present invention, the surface roughness of the tool rake face is kept below a constant value, while the crystal grain sizes of the polycrystalline diamond layer are restricted to a constant range on the tool rake face side and on the side of a surface bonded to the tool holder. Further, a portion forming the polycrystalline diamond layer up to a depth of 10 μm from the tool rake face contains carbon elements of extremely high purity, while most of the contained carbon atoms are diamond-bonded. Thus, the tool rake face is formed by a polycrystalline diamond layer containing a very small amount of impurities other than carbon. Therefore, deposition of work piece particles on the tool is effectively prevented during cutting. Since the physical surface roughness of the tool rake face is kept below a constant value, the resistance to such deposits of work piece particles is not reduced.

If the surface roughness of the tool rake face exceeds maximum height Rmax of 0.2 μm, particles of work piece material are remarkably deposited which is not desired.

If the polycrystalline diamond layer has crystal grain sizes of less than 0.01 μm on the tool rake face side, the wear resistance of the tool is unpreferable reduced. If the crystal grain sizes exceed 1 μm, on the other hand, the strength of the tool is unpreferably reduced. The lower limit of the crystal grain sizes of the polycrystalline diamond layer is defined as 5% of the thickness of the polycrystalline diamond layer on the side of the surface bonded to the tool holder in consideration of the wear resistance, while the strength of the tool is unpreferably reduced if the crystal grain sizes exceed 15% of the thickness of the polycrystalline diamond layer. If the amount of carbon elements contained in the portion of the polycrystalline diamond layer up to a depth of 10 μm from the tool rake face is less than 99 atomic percent, deposition of workpieces work piece particles is unpreferably caused. If the rate of diamond bonding of the a contained carbon atoms is less than 99%, deposition of work piece particles is unpreferably caused.

In the present method of manufacturing a polycrystalline diamond cutting tool, ion beam machining is performed on the surface of the polycrystalline diamond layer forming the tool rake face, and thereafter the polycrystalline diamond layer is heat treated in the normal atmosphere at a temperature in a range of at least 300° C. and not more than 500° C. The term "ion beam machining" indicates a method of ionizing a raw material gas which is introduced into a vacuum apparatus by discharge, and thereafter field-accelerating only positive charge ions contained in the ionized gas and applying the same to a target, thereby removing a part of the target by etching. When such ion beam machining is performed in a proper manner, it is possible to remove impurities other than carbon, such as a substrate material and carbides of elements forming the substrate material contained in the portion of the polycrystalline diamond layer forming the tool rake face. However, such removal unpreferably results in a residual of non-diamond carbon components which are co-grown during the ion beam machining. In order to remove such non-diamond carbon components, it is necessary to perform a heat treatment in the normal atmosphere after the ion beam machining. Such heat treatment must be performed in a temperature range of at least 300° C. and not more than 500° C. If the heating temperature is lower than 300° C., it is difficult to efficiently remove the non-diamond carbon components. If the heat treatment is performed at a higher temperature exceeding 500° C., on the other hand, the polycrystalline diamond layer itself is unpreferably damaged by the heat.

The ion beam machining and the heat treatment in the normal atmosphere may be performed after the tool member or tip is formed of the polycrystalline diamond layer and bonded to the tool holder prior to working of a cutting edge, or in a final step after working of the cutting edge. In any case, the ion beam machining and the heat treatment in the normal atmosphere may be performed on the surface of the polycrystalline diamond layer, which has been in contact with the substrate during synthesis of the polycrystalline diamond layer, after the substrate is removed and the polycrystalline diamond layer has been recovered.

While the ion source for the ion beam machining may be prepared of any raw material, oxygen is preferably employed in the present invention. This is because activating a reaction etching which is accompanied by an oxidizing reaction, is effective for efficiently removing impurities other than carbon in order to obtain a polycrystalline diamond layer which is substantially made only of diamond. While a raw material such as argon or nitrogen is used for simple etching, it is possible to implement a high-speed etching accompanied by an oxidizing reaction of diamond when the ion source is oxygen.

The portion of the polycrystalline diamond layer removed by the ion beam machining is preferably at least 0.02 $\mu$m and not more than 2 $\mu$m thick measured to the surface which has been in contact with the substrate during the synthesis. If the thickness of the removed portion is less than 0.02 $\mu$m, impurities causing deposition are incompletely removed. While it is possible to remove a portion of the polycrystalline diamond layer in excess of a thickness of 2 $\mu$m, on the other hand, this leads to an increase in the manufacturing cost since the impurities causing deposition are not contained in a portion exceeding 2 $\mu$m in thickness from the surface which has been in contact with the substrate during synthesis. If an excessive portion of the polycrystalline diamond layer is removed, coarse diamond crystal grains exceeding 1 $\mu$m in crystal grain size are exposed on the tool rake face, whereby the strength of the cutting edge is unpreferably reduced.

In manufacturing the present polycrystalline diamond cutting tool, the polycrystalline diamond layer can be synthesized by any well-known low-pressure vapor deposition. In other words, a method of decomposing and exciting a raw material gas through thermoionic emission or plasma discharge, or a film forming method employing a combustion flame can be applied. The raw material gas is generally prepared from a mixed gas which is mainly composed of an organic carbon compound of hydrocarbon such as methane, ethane or propane, alcohol such as methanol or ethanol, or ester, and hydrogen. In addition, the raw material may contain an inert gas such as argon, oxygen, carbon monoxide, water and the like in ranges neither inhibiting the synthesis of diamond nor deteriorating its characteristics.

The polycrystalline diamond layer preferably has a thickness of at least 0.1 mm and not more than 1.0 mm. If the thickness is smaller than 0.1 mm, the strength of the polycrystalline diamond layer itself is reduced. A diamond tool which is employed for ordinary finishing work may have a sufficient material thickness exceeding the width of the flank wear land (not more than 0.1 mm) at the end of the tool life, i.e., 0.1 to 0.2 mm, for example. The aforementioned lower limit of the thickness of 0.1 mm is set in consideration of this. If the thickness of the polycrystalline diamond layer exceeds 1.0 mm, the working cost for manufacturing the tool is unpreferably increased. However, a polycrystalline diamond layer having a thickness exceeding 1.0 mm has no performance problem.

The substrate to be provided with the polycrystalline diamond layer preferably has a thermal expansion coefficient which is close to that of diamond, in order to reduce the internal stress in the polycrystalline diamond layer. According to the present invention, the substrate is melted and removed by chemical treatment through hydrochloric acid, sulfuric acid, nitric acid, hydrofluoric acid and/or a mixed solution thereof so that only the polycrystalline diamond layer is recovered as a tool material to be formed into tips or tool members. Thus, the substrate is preferably made of a material containing elements such as Mo, W, Si and the like, to be melted and removed.

The surface of the substrate is finished as a mirror finished surface having a surface roughness of not more than 0.2 $\mu$m measured as maximum height Rmax, since the surface roughness of the substrate influences that of the finally obtained tool rake face. Namely, the surface roughness of the substrate is transferred to the surface of the polycrystalline diamond layer which is in contact therewith during synthesis. According to the present invention, the ion beam machining is performed on the surface of the polycrystalline diamond layer, in order to improve the surface roughness itself. If the surface roughness is excess of 0.2 $\mu$m in Rmax before the ion beam machining, the finally obtained tool rake face cannot attain a stable surface roughness of not more than 0.2 $\mu$m Rmax.

The tool material formed by the polycrystalline diamond layer can be bonded to the tool holder by any method. However, according to the present invention, the tool material is preferably simply bonded to the tool holder with an interposition of a brazing filler metal having a melting point in the range of at least 950° C. and not more than 1300° C. If the melting point of the brazing filler metal is lower than 950° C., the brazing filler metal is fluidized by the influence of the cutting heat depending on cutting conditions, to disadvantageously cause a defect. If the melting point of the brazing filler metal is higher than 1300° C., on the other hand, the polycrystalline diamond layer is thermally damaged when the same is bonded to the tool holder, to unpreferably reduce the wear resistance and the chipping resistance. The brazing filler metal optimumly contains at least one of metals belonging to the groups IVa, Va, VIa and VIIa of the periodic table and at least one of Au, Ag, Cu, Pt, Pd and Ni.

While the cutting edge can be worked by grinding of the type applied to a conventional diamond sintered body, it is possible to form a sharper cutting edge with smaller chipping by laser beam machining. A cutting tool provided with a laser-beam machined cutting edge having chipping of 0.5 to 5 $\mu$m is particularly superior in sharpness of the cutting edge compared to a conventional diamond sintered tool and a tool provided with a ground edge to which a tool material of vapor-deposited diamond is brazed. Formation of a cutting edge with laser beam machining is disclosed in Japanese Patent Application No. 2-271011 (1990) or 2-326277 (1990) (Japanese Patent Laying-Open No. 4-146007 (1992) or 4-193406 (1992)) by the inventors.

In the polycrystalline diamond cutting tool according to the present invention, as hereinabove described, the brazing layer is made of a heat resistant material and the thickness of the polycrystalline diamond layer is set in a prescribed range, whereby it is possible to implement a polycrystalline diamond cutting tool which is superior in its deposition resistance compared to a conventional tool. Thus, it is possible to implement a cutting tool which is particularly suitable for application requiring an excellent work surface roughness.

DESCRIPTION OF THE PREFERRED EMBODIMENTS

Embodiments of a polycrystalline diamond cutting tool according to the present invention are now described.

The polycrystalline diamond cutting tool according to the present invention is schematically described with reference to the manufacturing steps of the tool.

Figure 1:
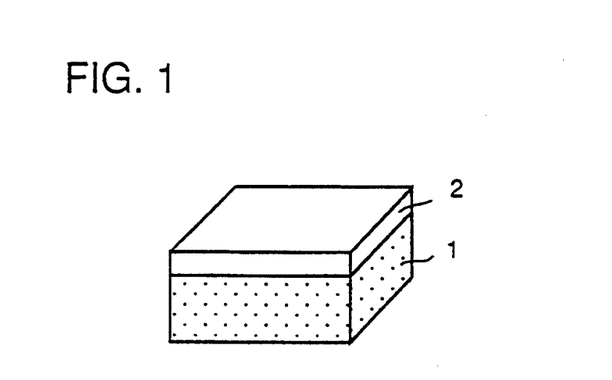
FIGS. 1 to 5 are perspective views and partially fragmented sectional views successively showing steps in a method of manufacturing a polycrystalline diamond cutting tool according to the present invention.

Referring to FIG. 1, a polycrystalline diamond layer 2 is formed on a surface of a substrate 1 which is made of a metal or an alloy, by low-pressure vapor deposition. The surface of the substrate 1 is finished as a mirror finished surface having a surface roughness of not more than 0.2 $\mu$m in Rmax.

The low-pressure vapor deposition is applied to the mirror finished surface to deposit on the substrate the polycrystalline diamond layer 2, which is substantially made only of diamond in such a sectional structure that the mean grain size of diamond is 0.01 to 1 $\mu$m on the substrate side in an initial stage of growth. The diamond size is increased to 5 to 15% of the thickness of the diamond layer on the side of a growth completion surface. The thickness of the diamond layer 2 is within the range of 0.1 to 1.0 mm. The grain sizes of the polycrystalline diamond are defined in the aforementioned range, in order to prevent a defect.

Figure 2:
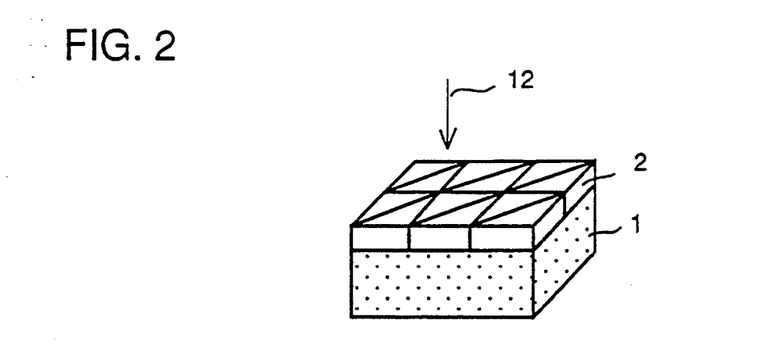

Then, cutting lines are formed in the polycrystalline diamond layer 2, on the substrate 1, with a laser beam 12 along prescribed tool material shapes, as shown in FIG. 2.

Figure 3:
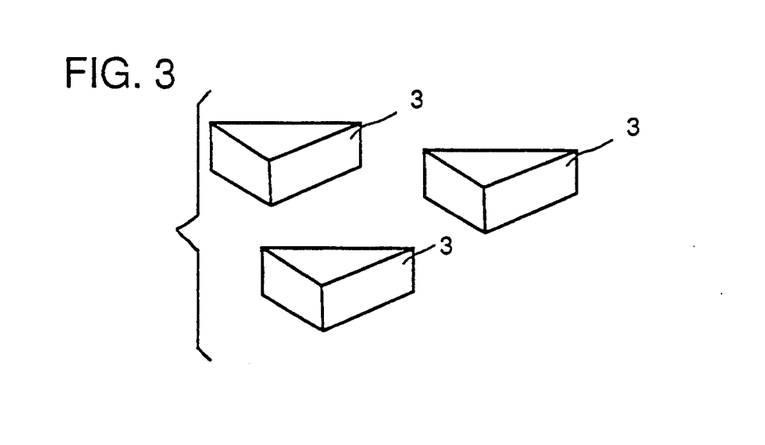
Figure 4:
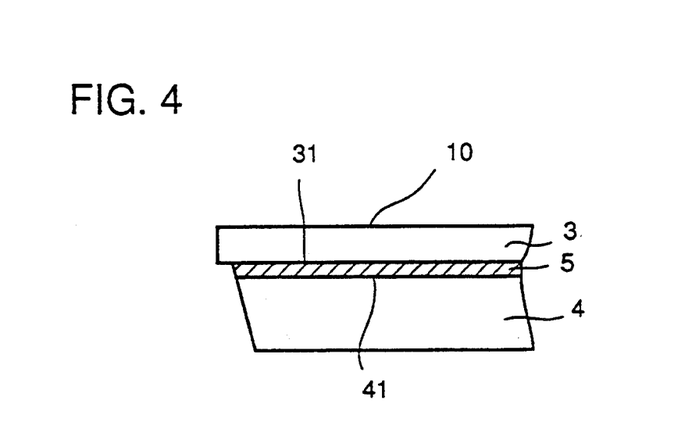

Then, chemical treatment is performed through hydrochloric acid, sulfuric acid, nitric acid, hydrofluoric acid or a mixed solution thereof to melt the substrate 1, thereby removing the same from the polycrystalline diamond layer 2, as shown in FIG. 3. The as-obtained polycrystalline diamond tool elements 3 are 0.1 to 1.0 mm in thickness along the direction of lamination, namely vertically in FIG. 3. Then, each polycrystalline diamond tool element 3 is bonded to a tool holder 4 through a brazing filler metal 5, as shown in FIG. 4. In order to bond the polycrystalline diamond tool element 3 to the tool holder 4, it is important to arrange the element 3 so that a surface which has been in contact with the substrate 1 during synthesis of the polycrystalline diamond layer 2, defines a rake face 10 of the tool. Prior to the synthesis of the polycrystalline diamond layer 2, the surface of the substrate 1 is finished as a mirror finished surface having a surface roughness of not more than 0.2 $\mu$m in Rmax. Thus, the polycrystalline diamond layer 2 deposited on the mirror finished surface of the substrate 1 has a smooth surface which is similar to the substrate surface, as a transfer surface. By brazing the tool element 3 to the holder 4 as just described so that the smooth surface of the element 3 defines the rake face 10 of the tool, it is possible to avoid working the rake surface 10 of the polycrystalline diamond tool element 3, which is regarded as being hard to work. As described above, the crystal grain sizes of the polycrystalline diamond layer 2 are smaller on the substrate side and increase in size toward the initially upper growth surface 31 which in FIG. 4 now faces the brazing 5. Thus, it is possible to form a tool which has an excellent chipping resistance by defining the tool rake face 10 by the fine-grain diamond surface initially provided on the substrate side. The brazing filler metal 5 is made of an alloy containing 0.2 to 50 volume percent of at least one metal selected from metals belonging to the groups IVa, Va, VIa and VIIa of the periodic table and the residue of at least one material selected from Au, Ag, Cu, Pt, Pd and Ni. The brazing filler metal 5 of such an alloy has a melting point of 800° to 1300° C., preferably 950° to 1300° C. This brazing filler metal 5 is interposed between the tool element 3 and a receiving surface 41 of the tool holder 4 and heated to a high temperature to be melted. Then the tool is cooled to bond the tool element 3 to the tool holder 4. The composition of the brazing filler metal 5 is defined as 0.2 to 50 volume percent of at least one metal selected from metals belonging to the groups IVa, Va, VIa and VIIa of the periodic table, since these metals or carbides thereof react with diamond to be bonded to the same. Among these metals, Ti, W, Ta and Zr or carbides thereof have a particularly excellent bond strength. The melting point of the brazing filler metal 5 is limited since the same may be softened and fluidized depending on cutting conditions if the melting point is below the aforementioned lower limit, while the polycrystalline diamond layer 2 is deteriorated if the melting point is higher than the upper limit.

Figure 5:
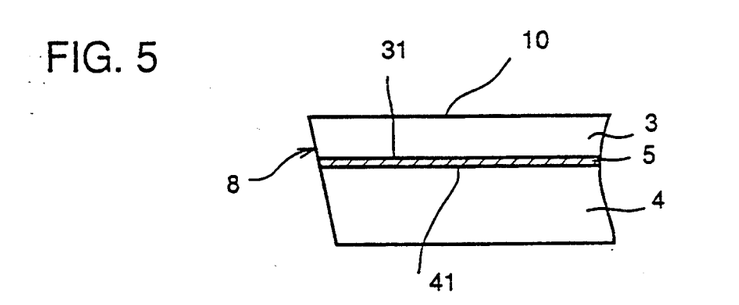

Thereafter a cutting edge 8 is worked by grinding or laser beam machining, as shown in FIG. 5. When the cutting edge 8 is formed by laser beam machining, it is possible to suppress chipping to 0.5 to 5 $\mu$m. A polycrystalline diamond cutting tool is manufactured by the aforementioned steps.

Figure 6:
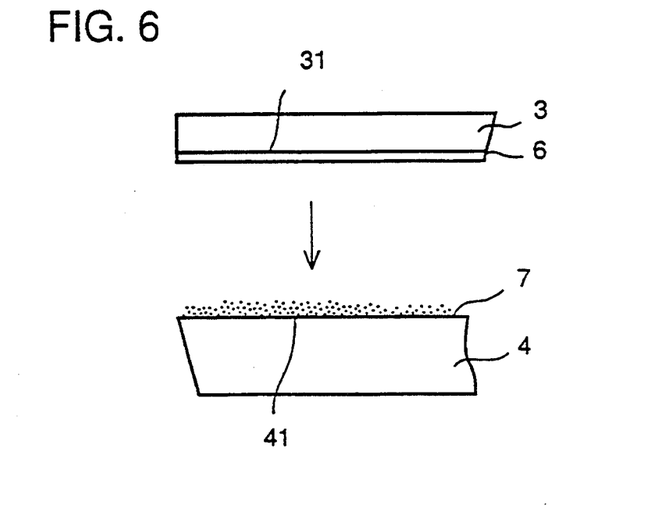
FIG. 6 is a partially fragmented sectional view showing a principal step in another method of manufacturing a polycrystalline diamond cutting tool according to the present invention.

FIG. 6 shows another embodiment of a method of bonding a tool material 3 to a tool holder 4. First, a bond improving covering layer 6 is formed on a polycrystalline diamond upper growth surface 31 of the tool element 3. The layer 6 has a thickness of about 0.1 to 5 $\mu$m. This covering layer 6 is formed by ion plating, sputtering or vapor deposition, for example. The covering layer 6 is made of an least one element selected from metals belonging to the groups IVa, Va, VIa and VIIa of the periodic table or carbides thereof. The above thickness of the covering layer 6 is selected since no effect of preventing oxidation is attained if the thickness is less than 0.1 $\mu$m. If the thickness exceeds 5 $\mu$m, on the other hand, the cost is undesirably increased. After the covering layer 6 has been formed on the tool element 3, a brazing material 7 including at least one element selected from Au, Ag, Cu, Pt, Pd and Ni is arranged on a bonding surface 41 of the tool holder 4. Then the tool element 3 with the cover layer 6 and the tool holder 4 with the brazing material 7 are arranged into a bonding position relative to each other and heated, to melt the layers 6 and 7 for the brazing. Thus, the tool element 3 is bonded to the tool holder 4 through the brazing filler metal formed of the layers 6 and 7. When the covering layer 6 is made of at least one material selected from Ti, W, Ta and Zr and carbides thereof, the bond strength is particularly improved.

EXAMPLE 1

A diamond polycrystalline substance was synthesized on an Si substrate having a mirror finished surface of 0.08 μm in Rmax, by microwave plasma CVD for 10 hours under the following conditions:

Raw Material Gas (Flow Rate): $H_2$ 300 sccm $CH_4$ 20 sccm
Gas Pressure: 120 Torr
Microwave Oscillation Output: 750 W After the synthesis, the substance was dipped in nitric-hydrofluoric acid to melt and remove only the Si substrate, whereby it was possible to recover the diamond polycrystalline substance having a thickness of 0.2 mm in thickness. The diamond polycrystalline substance was in such a sectional structure that the mean grain size of diamond was 0.2 μm on a rake face side and increased to 20 μm on a brazing surface side. The surface which had been in contact with the substrate had a surface roughness of 0.08 μm Rmax. This diamond polycrystalline substance was brazed to a shank of cemented carbide with a heat resistant brazing filler metal containing 6 volume percent of Ag, 95 volume percent of Cu and 4 volume percent of Ti. In this brazing step, a growth surface of the tool material was regarded as a bonding surface. The brazing filler metal was heated to its melting point of 1050° C. in a vacuum of $5 \times 10^{-5}$ Torr for 10 minutes. The so produced substance had a brazing layer 30 μm thick. Only a flank was worked with a diamond-grindstone of #1500 to be provided with a cutting edge, thereby preparing a sample A of a cutting tool.

For the purpose of comparison, a diamond polycrystalline substance similar to the above was bonded to a shank of cemented carbide with a brazing filler metal containing 30 volume percent and 70 volume percent of Ag and Cu respectively and having a melting point of 700° C., to prepare a comparative sample B. This sample B had a brazing layer 40 μm thick.

On the other hand, sintered diamond of 5 μm in grain size containing 12 volume percent of Co as a binder was surface-finished into 0.09 μm in Rmax to prepare a tool material, which was bonded to a shank of cemented carbide with the same brazing filler metal as that for the sample B, thereby preparing another comparative sample C. The comparative samples B and C were also provided with cutting edges through grinding with the same diamond grindstone as that for the sample A. These samples A, B and C were applied to throw-away tipped tools, and subjected to a performance evaluation under the following conditions:

Cutting Conditions

Workpieces: round bar of A390-T6 (Al-17% Si)
Cutting Speed: 800 m/min.
Depth of Cut: 1.5 mm
Feed Rate: 0.2 mm/rev.
Cooling Solution: water-soluble oil solution

Evaluation Method

The cutting edge states were compared after cutting for 5 minutes and again after 60 minutes As the result, it was shown that a sharp cutting edge was maintained in the present tool for a longer time as compared with the sintered diamond tool, as shown in Table 1. It was also shown that the tool employing no heat resistant brazing filler metal caused a large defect after outflow of the brazing filler metal, leading to critical damage of the tool.

TABLE 1

| Sample | Width of Flank Wear Land (μm) | |
|---|---|---|
| | After Cutting for 5 Minutes | After Cutting for 60 Minutes |
| Invention Sample A | 21 | 67 |
| Comparative Sample B | Brazing Filler Metal Flown Out Chipped | — |
| Comparative Sample C (Sintered Diamond) | 28 | 123 |

Example 2

A linear tungsten filament of 0.5 mm in diameter and 100 mm in length was employed as a thermoionic emission material, to synthesize diamond on a surface of an Mo substrate having a surface roughness of 0.03 μm in Rmax by thermal CVD for 20 hours, under the following conditions:

Raw Material Gas (Flow Rate): $H_2$ 500 sccm $C_2H_2$ 10 sccm
Gas Pressure: 70 Torr
Filament Temperature: 2200° C.
Filament-to-Substrate Distance: 6 mm
Substrate Temperature: 900° C.

After the synthesis, the substance was dipped in hot aqua regia so that only the Mo substrate was melted and removed, whereby it was possible to recover a diamond polycrystalline substance of 0.3 mm thick. This diamond polycrystalline substance had such a sectional structure that the mean grain size of diamond was 0.1 μm on a rake face side and increased to 25 μm on a brazing surface side. The surface which had been in contact with the substrate had a surface roughness of 0.03 μm in Rmax. This diamond polycrystalline substance was brazed to a shank of cemented carbide with a heat resistant brazing filler metal containing 35 volume percent of Au, 60 volume percent of Cu, and 5 volume percent of Ta respectively. In this brazing step, a growth surface of the tool material was regarded as a bonding surface, while the brazing filler metal was heated to its melting point of 1100° C. in a vacuum of $4 \times 10^{-5}$ Torr for 5 minutes. The so produced substance had a brazing layer of 40 μm in thickness. Thereafter a cutting edge was formed with a YAG laser, to prepare a sample D.

For the purpose of comparison, a tool material and a brazing filler metal similar to those for the sample D were employed for bonding, to prepare a comparative sample E having a brazing layer of 100 μm in thickness.

Further, sintered diamond of 10 μm in grain size containing 10 volume percent of Co as a binder was worked into a mirror finished surface of 0.06 μm Rmax to form a tool material, which in turn was bonded to a shank of cemented carbide with a brazing filler metal containing 10 volume percent of Pd, 60 volume percent of Ag and 30 volume percent of Cu, respectively and having a melting point of 800° C., to prepare another comparative sample F. The samples E and F were provided with cutting edges by grinding with a diamond grindstone of #1500.

These samples were applied to throw-away tipped tools, and subjected to a performance evaluation under the following conditions:

Cutting Conditions

Workpiece: hard carbon
Cutting Speed: 1000 m/min.
Depth of Cut: 1.5 mm
Feed Rate: 0.2 mm/rev.
Cutting Time: 40 min.
Cooling Solution: water soluble oil solution

Evaluation Method

Comparison of the cutting edge states after cutting for 5 minutes and again after 40 minutes As the result, it was found that the present tool maintained a sharp cutting edge for a longer time as compared with the sintered diamond tool, as shown in Table 2. It was also shown that the diamond polycrystalline substance was chipped in the sample E employing the brazing filler metal of the same composition as that of the present sample, due to the substantial displacement caused by the thickness of the brazing layer.

TABLE 2

| Sample | Chipping Before Cutting ($\mu$m) | Width of Flank Wear Land ($\mu$m) ||
|---|---|---|---|
| | | After Cutting for 5 Minutes | After Cutting for 40 Minutes |
| Invention Sample D | 1 | 23 | 91 |
| Comparative Sample E | 12 | 24 | Chipped |
| Comparative Sample F | 20 | 27 | 125 |

Example 3

A linear tantalum filament with a diameter of 0.3 mm and a length of 120 mm length was employed as a thermoionic emission material, to synthesize polycrystalline diamond on a surface of an Si substrate having surface roughness of 0.12 $\mu$m Rmax by thermal CVD for 30 hours under the following conditions:

Raw Material Gas (Flow Rate): $H_2$ 400 sccm $CH_4$ 10 sccm
Gas Pressure: 100 Torr
Filament with a diameter Temperature: 2100° C.
Filament with a diameter-to-Substrate Temperature: 5 mm
Substrate Temperature: 950° C.

After the synthesis, the substance was dipped in heated nitric-hydrofluoric acid so that only the Si substrate was melted and removed, whereby it was possible to recover a diamond polycrystalline substance of 0.4 mm thick. The diamond polycrystalline substance had such a sectional structure that the mean grain size of diamond was 0.4 $\mu$m on a rake face side and increased to 30 $\mu$m on a brazing surface side. The surface which had been in contact with the substrate was 0.12 $\mu$m Rmax. An upper growth surface of this diamond polycrystalline substance was covered with a Ti layer 2 $\mu$m thick, which in turn was covered with an oxidation inhibiting film of Ni 3 $\mu$m thick. The metal-coated diamond polycrystalline substance was brazed to a shank of cemented carbide with a brazing filler metal of Pt, Pd and Ni. In this brazing step, the growth surface of the tool material was regarded as a bonding surface, while the brazing filler metal was heated to its melting point of 980° C. at the normal atmosphere for 2 minutes. The so produced substance had a brazing layer 30 $\mu$m thick. Thereafter a cutting edge was formed with a YAG laser, to prepare a sample G.

For the purpose of comparison, a metal-coated tool material similar to that in the sample G was bonded to a shank of cemented carbide with a brazing filler metal of Ag and Cu having a melting point of 700° C., to prepare a comparative sample H.

On the other hand, sintered diamond having a grain size of 3 $\mu$m and containing 12 volume percent of Co as a binder was worked into a mirror finished surface of 0.12 $\mu$m Rmax to form a tool material, which in turn was bonded to a shank of cemented carbide with a brazing filler metal containing 10 volume percent of Pd 60 volume percent of Ag, and 30 volume percent of Cu, respectively. The brazing material had a melting point of 800° C. Thus, comparative sample I was prepared. The samples H and I were provided with cutting edges by grinding with a diamond grindstone of #1500.

These samples were applied to throw-away tipped tools and subjected to a performance evaluation under the following conditions:

Cutting Conditions

Workpiece: round bar of Al-25% Si
Cutting Speed: 1000 m/min.
Depth of Cut: 1.2 mm
Feed Rate: 0.15 mm/rev.
Cutting Time: 30 min.
Cooling Solution: none (dry type)

Evaluation Method

Comparison of cutting edge states after cutting for 10 minutes and again after 30 minutes.

As the result, it was found that the present tool maintained a sharp cutting edge for a longer time as compared with the sintered diamond tool, as shown in Table 3. It was also shown that the tool prepared with no heat resistant brazing filler metal caused a large defect after outflow of the brazing filler metal, leading to critical damage of the tool.

TABLE 3

| Sample | Chipping Before Cutting ($\mu$m) | Width of Flank Wear Land ($\mu$m) ||
|---|---|---|---|
| | | After Cutting for 10 Minutes | After Cutting for 30 Minutes |
| Invention Sample G | 2 | 22 | 59 |
| Comparative Sample H | 10 | 24 | Chipped |
| Comparative Sample I | 15 | 30 | 125 |

Example 4

Under conditions shown Table 4, a gas obtained by mixing $H_2$, $C_2H_6$ and Ar in the ratios of 7:2:1 was supplied into reaction tubes in which W substrates having mirror finished surface of 0.05 $\mu$m Rmax were placed. The flow rate was 500 sccm for adjusting the pressures to 120 Torr. Then, a high frequency of 13.56 MHz was supplied from a high frequency oscillator at an output of 700 W to excite the mixed gas and generate plasma, thereby synthesizing a diamond polycrystalline substances.

After the synthesis, only the substrates were melted and removed by acid treatment, whereby it was possible to recover only diamond polycrystalline substances with mirror finished surfaces, which had been in contact with the substrates, of 0.05 $\mu$m Rmax. Table 4 also shows the characteristics of these substances.

Tool materials were formed by these diamond polycrystalline substances and the growth surfaces thereof were regarded as bonding surfaces, to be brazed to shanks of cemented carbide with brazing filler metals shown in Table 4. Thereafter cutting edges were formed with diamond grindstones and by laser beam machining.

The so produced samples were applied to throwaway tipped tools and subjected to a performance evaluation under the following conditions:

Cutting Conditions

Workpiece: round bar of Al-22% Si provided with eight axial grooves having V-shaped sections
Cutting Speed: 900 m/min.
Depth of Cut: 0.8 mm
Feed Rate: 0.12 mm/rev.
Cooling Solution: water-soluble oil solution Evaluation Method Comparison of cutting edge states by cutting for up to 60 minutes
Table 4 shows the results.

TABLE 4

| Sample | J | K | L | M | N | O | P |
|---|---|---|---|---|---|---|---|
| Thickness of Diamond Film (mm) | 0.2 | 0.05 | 0.6 | 0.9 | 0.15 | 0.25 | 0.3 |
| Grain Size on Substrate Side ($\mu$m) | 0.2 | 0.1 | 0.3 | 0.1 | 0.8 | 0.2 | 2.2 |
| Grain Size on Growth Surface Side ($\mu$m) | 20 | 5 | 30 | 25 | 10 | 20 | 80 |
| Components of Brazing Filler Metal (vol. %) | Au: 30 Cu: 65 Ti: 5 | Pd: 60 Ni: 30 Ta: 10 | Au: 80 Ni: 5 Zr: 15 | Au: 50 Pd: 25 Ti: 25 | Ag: 70 Cu: 22 W: 8 | Pt: 50 Ni: 10 Ti: 40 | Au: 5 Cu: 85 Ta: 10 |
| Melting Point of Brazing Filler Metal (°C.) | 1,080 | 1,200 | 980 | 1,150 | 850 | 1,280 | 1,020 |
| Thickness of Brazing Layer ($\mu$m) | 30 | 20 | 100 | 15 | 35 | 20 | 30 |
| Method of Working Cutting Edge | Laser | Grinding | Grinding | Laser | Laser | Grinding | Grinding |
| Result of Cutting Evaluation | Worn by 60 $\mu$m | Chipped in 2 min. | Chipped in 5 min. | Worn by 58 $\mu$m | Chipped in 3 min. | Worn by 62 $\mu$m | Chipped in 3 min. |

The samples K, L, N and P were chipped quickly. On the other hand, the samples J, M and O exhibited an excellent wear resistance, chipping resistance and heat resistance, while it was shown that these samples maintained sharp cutting edges for a long time.

Example 5

A polycrystalline diamond layer was synthesized on a mirror finished surface of an Si substrate having a surface roughness of 0.08 $\mu$m Rmax for 25 hours by microwave plasma CVD under the following conditions:
Raw Material Gas (Flow Rate): H$_2$ 250 sccm CH$_4$ 8 sccm
Gas Pressure: 80 Torr
Microwave Oscillation Output: 700 W After the synthesis, the substance was dipped in nitric-hydrofluoric acid so that only the Si substrate was melted and removed, whereby it was possible to recover a polycrystalline diamond layer 0.3 mm thick. The surface of the polycrystalline diamond layer, which had been in contact with the substrate during the synthesis, was 0.08 $\mu$m Rmax. Further, the diamond layer was has a sectional structure wherein the mean grain size was 0.2 $\mu$m on a tool rake face side and increased to 20 $\mu$m on a brazing surface side.

This polycrystalline diamond layer was placed into an ion beam machining apparatus and oxygen gas was introduced into this apparatus. This gas was ionized to generate oxygen cations, which in turn were field-accelerated at 500 V and applied to the surface of the polycrystalline diamond layer, which had been in contact with the substrate during the synthesis. This treatment was performed for 1 hour to remove a portion of the polycrystalline diamond layer up to a depth of 1 $\mu$m from its surface, while the polycrystalline diamond was converted to generate amorphous carbon. Then, the polycrystalline diamond layer was heated in an a furnace at the normal atmosphere and at a temperature of 450° C. for 2 hours, to remove the amorphous carbon.

It was shown by analysis that a portion of the polycrystalline diamond layer up to a depth of 10 $\mu$m from the treated surface was composed of 99.9 atomic percent of carbon elements and 0.1 atomic percent of Si elements, while 99.8% of carbon atoms were diamond-bonded. Further, the surface roughness was improved to 0.07 $\mu$m Rmax.

This polycrystalline diamond layer was cut with a laser beam into an equilateral triangular tool material having edges of 5 mm. The tool material was brazed to a shank of cemented carbide with a heat resistant brazing filler metal containing 6 volume percent of Ag, 95 volume percent of Cu, and 4 volume percent of Ti respectively. This brazing step was carried out by heating for 10 minutes the brazing filler metal to its melting point of 1050° C. in a vacuum of 5 × 10$^{-5}$ Torr so that the ion beam machined surface of the tool material defined a tool rake face. Thereafter only a flank was worked with a diamond grindstone of #1500 to provide a cutting edge. Thus sample Q was formed.

For the purpose of comparison, a tool material was made of a polycrystalline diamond layer which was similar to the above with neither an ion beam machining nor a heat treatment at the normal atmosphere, and brazed to a shank of cemented carbide to prepare a comparative sample R. In this sample R, it was confirmed by analysis that a portion of the polycrystalline diamond layer up to a depth of 10 μm from a tool rake face was composed of 98 atomic percent of carbon elements and 2 atomic percent of Si elements, while 98% of the as-contained carbon atoms were diamond-bonded.

On the other hand, sintered diamond having a grain size of 5 μm containing 12 volume percent of Co as a binder was worked into a mirror finished surface of 0.09 μm Rmax to form a tool material, which in turn was bonded to a shank of cemented carbide with interposition of a brazing filler metal having a melting point of 650° C., thereby preparing another comparative sample S.

The comparative samples R and S were also provided with cutting edges by grinding with the same diamond grindstone as that for the sample Q.

These samples were applied to throw-away tipped tools and subjected to a performance evaluation under the following conditions:

Cutting Conditions

Workpiece: round bar of ADC12 (Al-12% Si)
Cutting Speed: 800 m/min.
Depth of Cut: 0.8 mm
Feed Rate: 0.05 mm/rev.
Cooling Solution: none Evaluation Method Comparison of cutting edge states and work surface roughness after cutting for 5 minutes and again after 60 minutes.

As the result, it was shown that the present cutting tool had a remarkably improved deposition resistance compared tool the conventional tool employing vapor-deposited diamond. The present also maintained a sharp cutting edge for a long time as compared with the sintered diamond tool, as shown in Table 5.

TABLE 5

| Sample | Deposition | Works Surface Roughness: Rmax (μm) | |
|---|---|---|---|
| | | After Cutting for 5 Min. | After Cutting for 60 Min. |
| Invention Sample Q | None | 1.2 | 1.5 |
| Comparative Sample R | Marred Slightly by Deposits | 2.5 | 2.7 |
| Comparative Sample S (Sintered Diamond) | None | 2.3 | 3.8 |

Example 6

A linear tantalum filament of 0.4 mm diameter and 200 mm in length was employed as a thermoionic emission material to synthesize a polycrystalline diamond layer on a surface of an Mo substrate having surface roughness of 0.12 μm Rmax by thermal CVD for 40 hours, under the following conditions:

Raw Material Gas (Flow Rate): H₂ 350 sccm C₂H₂ 18 sccm
Gas Pressure: 100 Torr
Filament Temperature: 2200° C.
Filament-to-Substrate Distance: 8 mm
Substrate Temperature: 980° C.

After the synthesis, the substance was dipped in hot aqua regia so that only the Mo substrate was melted and removed, whereby it was possible to recover a polycrystalline diamond layer of 0.4 mm in thick. The surface of the polycrystalline diamond layer, which had been in contact with the substrate during the synthesis, had a roughness of 0.12 μm Rmax. Further, the diamond layer had such a sectional structure that the mean crystal grain size was 0.1 μm on a tool rake face side and increased to 30 μm on a brazing surface side.

This polycrystalline diamond layer was cut with a laser beam to form a tool material, which in turn was brazed to a shank of cemented carbide with a heat resistant brazing filler metal containing 5 volume percent of Ag, 93 volume percent of Cu, and 2 volume percent of Ti respectively. This brazing step was carried out so that the surface which had been in contact with the substrate during the synthesis defined a tool rake face. After the brazing step, a cutting edge was formed with a YAG laser, to prepare a sample T.

In order to improve the surface of the rake face of this tool a, surface treatment was performed under the following conditions: First, this tool was placed into an ion beam machining apparatus and argon gas was introduced into this apparatus. The argon gas was ionized to generate argon cations, which in turn were field-accelerated at 450 V and applied to the surface of the polycrystalline diamond layer which had been in contact with the substrate during the synthesis. This treatment was performed for 3 hours, to remove a portion of the layer up to a depth of 1.7 μm from its surface, while the polycrystalline diamond was converted to generate amorphous carbon. Then the tool was heated in a furnace at the normal atmosphere and at 420° C. for 3 hours, to remove the amorphous carbon.

It was shown by analysis that a portion of the polycrystalline diamond layer up to a depth of 10 μm from the tool rake face was composed of 99.2 atomic percent of carbon elements and 0.8 atomic percent of Mo elements in the as-treated sample U, while 99.5% of carbon atoms were diamond-bonded. Further, the surface roughness was improved to a roughness of 0.1 μm Rmax.

On the other hand, sintered diamond of 10 μm in grain size containing 8 volume percent of Co as a binder was worked into a mirror finished surface of 0.1 μm Rmax, to form a tool material. Thereafter the tool material was bonded to a shank of cemented carbide with a brazing filler metal having a melting point of 680° C., to prepare a comparative sample V. This sample V was provided with a cutting edge by grinding with a diamond grindstone of #1500.

These samples were applied to throw-away tipped tools and subjected to a performance evaluation under the following conditions:

Cutting Conditions

Workpiece: AC2A (Al-5% Si)
Cutting Speed: 1000 m/min.
Depth of Cut: 0.5 mm
Feed Rate: 0.1 mm/rev.
Cutting Time: 90 min.
Cooling Solution: water-soluble oil solution Evaluation Method Comparison of cutting edge states after cutting for 5 minutes and again after 60 minutes.

As the result, it was confirmed that the present sample U had an improved deposition resistance as compared with the conventional vapor-deposited diamond tool which was not subjected to no any surface treatment, to sufficiently effectuate its characteristic of a sharp cutting edge, as shown in Table 6. It was also shown that the present tool has an excellent performance characteristic as compared with the sintered diamond tool.

TABLE 6

| Sample | Deposition | Works Surface Roughness: Rmax (μm) | |
|---|---|---|---|
| | | After Cutting for 5 Min. | After Cutting for 60 Min. |
| Comparative Sample T | Marred Slightly by Deposits | 2.8 | 3.2 |
| Invention Sample U | None | 1.8 | 1.9 |
| Comparative Sample V (Sintered Diamond) | None | 2.7 | 3.8 |

Example 7

Under conditions shown Table 7, a gas obtained by mixing $H_2$, $C_2H_6$ and Ar in the ratios of 8:1:1 was supplied into reaction tubes, in which W substrates having mirror finished surfaces of 0.15 μm Rmax were placed, at a flow rate of 550 sccm, to adjust pressures to 200 Torr. Then, a high frequency of 13.56 MHz was supplied by a high frequency oscillator at an output of 900 W to excite the mixed gas and generate plasma, thereby synthesizing polycrystalline diamond substances.

After the synthesis, only the substrates were melted and removed by acid treatment, whereby it was possible to recover only polycrystalline diamond substances having mirror finished surfaces, which had been in contact with the substrates and having a roughness of 0.12 μm Rmax. Table 7 also shows the characteristics of these substances.

The polycrystalline diamond substances were employed as tool materials, which were bonded by brazing to shanks of cemented carbide with brazing filler metals shown in Table 7, so that the surfaces which had been in contact with the substrates during the synthesis defined tool rake faces. Thereafter cutting edges were formed with a diamond grindstone or by laser beam machining. Further a surface treatment was performed under the conditions shown in Table 7.

The so produced tools were applied to throw-away tipped tools and subjected to analysis of the rake faces and to a performance evaluation under the following conditions:

Cutting Conditions

Workpiece: A2218 (Al-4% Cu-2% Ni-1.5% Mg) provided with four longitudinal grooves having V-shaped sections
Cutting Speed: 1200 m/min.
Depth of Cut: 0.5 mm
Feed Rate: 0.08 mm/rev.
Cooling Solution: none Evaluation Method Comparison of work surface roughness values by cutting for up to 60 minutes
Table 7 shows the results.

Samples Y and b, which were surface-treated at temperatures out of the temperature range for the heat treatment in the normal atmosphere according to the present method of manufacturing a polycrystalline diamond cutting tool, were marred by deposition causing an inferior work surface roughness. It is conceivable that the polycrystalline diamond layer was thermally deteriorated in the sample Y, due to the high temperature employed for the heat treatment. In the sample b, on the other hand, it may have conceivably been impossible to remove amorphous carbon due to the low temperature employed for the heat treatment.

The samples other than Y and b exhibited an excellent deposition resistance, with excellent values for the work surface roughness during initial cutting. However, the sample X was chipped after cutting for a long time, conceivably because the thickness of the polycrystalline diamond layer was small. The sample was also chipped after cutting for a long time, conceivably because the brazing filler metal employed for bonding the tool material to the tool holder had a low melting point and hence the same was softened and fluidized during cutting.

On the other hand, the samples W, Z and c exhibited an excellent deposition resistance and had an excellent wear resistance, chipping resistance and heat resistance, while it was shown that these samples maintained sharp cutting edges for a long time.

TABLE 7

| Sample | W | X | Y | Z | a | b | c |
|---|---|---|---|---|---|---|---|
| Thickness of Diamond Layer (mm) | 0.25 | 0.08 | 0.63 | 0.87 | 0.18 | 0.28 | 0.36 |
| Diamond Grain Size (μm) | | | | | | | |
| Substrate Side | 0.05 | 0.07 | 3.5 | 0.02 | 0.8 | 0.3 | 0.05 |
| Glowth Surface Side | 25.0 | 5.0 | 30.0 | 15.0 | 12.0 | 20.0 | 10.0 |
| Melting Point of Brazing Filler Metal (°C.) | 1,080 | 1,200 | 980 | 1,150 | 850 | 1,280 | 1,020 |
| Method of Working Cutting Edge | Laser | Grinding | Grinding | Laser | Laser | Grinding | Grinding |
| Ion Beam Machining Conditions | Oxygen 500 V | Ar 480 V | Ne 600 V | He 700 V | Oxygen 460 V | Ar 520 V | Oxygen 700 V |
| Heating Conditions in Atmosphere | 380° C. | 450° C. | 700° C. | 480° C. | 320° C. | 200° C. | 340° C. |
| <Result of Surface Treatment> | 0.05 μm | 1.8 μm | 1.6 μm | 0.2 μm | 0.7 μm | 0.55 μm | 1.2 μm |
| Depth of Removal | 0.10 μm | 0.08 μm | 0.06 μm | 0.11 μm | 0.09 μm | 0.07 μm | 0.05 μm |
| Rake Face Roughness: Rmax | | | | | | | |
| <Result of Analysis> W Element Content | 0.2 at.% | 0.8 at.% | 0.5 at.% | 0.3 at.% | 0.1 at.% | 0.4 at.% | 0.6 at.% |
| Ratio of Diamond Bonding of Carbon Atoms | 99.8% | 99.2% | 23.5% | 99.7% | 99.4% | 97.3% | 99.6% |
| <Result of Cutting Deposition> | None | None | Deposited | None | None | Deposited | None |
| Work Surface Roughness: Rmax (μm) | | | | | | | |
| After 5 minutes | 1.2 | 1.3 | 5.6 | 1.1 | 1.3 | 2.8 | 1.2 |

TABLE 7-continued

| Sample | W | X | Y | Z | a | b | c |
|---|---|---|---|---|---|---|---|
| After 60 Minutes | 1.5 | Chipped | Chipped | 1.1 | Chipped | 2.9 | 1.4 |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A polycrystalline diamond cutting tool comprising a tool holder, a tool member, and a brazing layer made of a brazing filler mental having a melting point of at least 950° C. and not more than 1300° C., said brazing layer bonding said tool member to said tool holder, said tool member comprising a polycrystalline diamond layer that has been synthesized on a substrate by low-pressure vapor deposition, said polycrystalline diamond layer having a thickness within the range of at least 0.1 mm and not more than 1.0 mm, said tool member having a rake surface and, opposite said rake surface, a bonding surface bonded to said tool holder through said brazing layer, said polycrystalline diamond layer having a grain size distribution that increases from said rake surface to said bonding surface, and wherein diamond grain sizes are within the range of 0.01 μm to 1.0 μm on the side of said rake surface and within the range of at least 5% and not more than 15% of said diamond layer thickness on the side of said bonding surface.

2. The tool of claim 1, wherein said brazing layer contains at least one element selected from the group consisting of metals belonging to the groups IVa, Va, VIa and VIIa of the periodic table and carbides of said metals, and at least one metal selected from the group consisting of Au, Ag, Cu, Pt, Pd and Ni.

3. The tool of claim 1, wherein said brazing layer is formed by a first layer positioned on the side of said tool holder, said first layer containing at least one metal selected from the group consisting of Au, Ag, Cu, Pt, Pd and Ni, and a second layer positioned on the side of said diamond layer, said second ply containing at least one element selected from the group consisting of metals belonging to the groups IVa, Va, VIa and VIIa of the periodic table and carbides of said metals.

4. The tool of claim 3, wherein said second layer of said brazing layer contains at least one element selected from the group consisting of Ti, W, Ta and Zr and carbides thereof, said second layer having a thickness of at least 0.1 μm and not more than 5 μm.

5. The tool of claim 1, wherein said brazing layer has a thickness of at least 10 μm and not more than 50 μm.

6. The tool of claim 1, wherein said bonding surface is formed by an upper growth surface of said polycrystalline diamond layer, and wherein said rake surface is formed by a surface that was in contact with said substrate during synthesis, and said rake surface has a surface roughness not more than 0.2 μm maximum height Rmax.

7. The tool of claim 1, wherein said polycrystalline diamond layer has a chipping of at least 0.5 μm and not more than 5 μm on a cutting edge along an intersection line of said rake surface and a tool flank.

8. The tool of claim 1, wherein said tool holder is cemented carbide.

9. A method of manufacturing a polycrystalline diamond cutting tool having a tool member brazed to a tool holder, comprising the following steps:
    (a) providing a substrate having a surface with a roughness of not more than 0.2 μm Rmax;
    (b) forming a polycrystalline diamond layer on said substrate surface by low-pressure vapor deposition until said diamond layer has a layer thickness within the range of 0.1 mm to 1.0 mm and wherein a mean grain size of said polycrystalline diamond increases in a direction of crystal growth from said substrate to an outer diamond layer growth surface, wherein said mean grain size is at least 0.01 μm and not more than 1 μm toward said substrate and at least 5% and not more than 15% of said layer thickness of said polycrystalline diamond layer toward said outer growth surface;
    (c) removing said substrate from said polycrystalline diamond layer;
    (d) cutting said polycrystalline diamond layer into a tool member shape;
    (e) selecting a brazing filler metal of an alloy containing at least one metal selected from the group consisting of the groups IVa, Va, via and VIIa of the periodic table and carbides thereof and at least one metal selected from the group consisting of Au, Ag, Cu, Pt, Pd and Ni;
    (f) interposing said brazing filler metal between said tool holder and said outer growth surface; and
    (g) heating and melting said brazing filler metal thereby bonding said tool member to said tool holder wherein the polycrystalline diamond layer surface removed from said substrate defines a tool rake face.

10. The method of claim 9, wherein said brazing filler metal is an alloy having a melting point of at least 950° C. and not more than 1300° C.

11. The method of claim 9, wherein said brazing filler metal contains at least 0.2 volume percent and not more than 50 volume percent of at least one metal selected from the group consisting of the groups IVa, Va, VIa and VIIa of the periodic table.

12. The method of claim 9, wherein said brazing filler metal comprises a layer having a thickness of at least 10 μm and not more than 50 μm.

13. The method of claim 9, wherein said substrate is removed by melting in at least one solution selected from the group consisting of hydrochloric acid, sulfuric acid, nitric acid and hydrofluoric acid.

14. A method of manufacturing a polycrystalline diamond cutting tool having a tool member brazed to a tool holder, comprising the following steps:
    (a) preparing a substrate having not more than 0.2 μm Rmax;
    (b) forming a polycrystalline diamond layer on said substrate surface by low-pressure vapor deposition until said diamond layer has a layer thickness within the range of 0.1 mm to 1.0 mm and wherein a mean grain size of said polycrystalline diamond increases in a direction of crystal growth from said substrate to an outer diamond layer growth surface, wherein said mean grain size is at least 0.01

μm and not more than 1 μm toward said substrate and at least 5% and not more than 15% of said layer thickness of said polycrystalline diamond layer toward said outer growth surface;

c) removing said substrate from said polycrystalline diamond layer;

d) cutting said polycrystalline diamond layer into a tool member shape;

e) covering said outer growth surface of said tool member shape with at least one material selected from the group consisting of the groups IVa, Va, VIa and VIIa of the periodic table and metal carbides thereof, forming a covering layer on said outer growth surface;

f) interposing a brazing filler metal containing at least one material selected from the group consisting of Au, Ag, Cu, Pt, Pd and Ni between said tool holder and said covering layer, and g) heating and melting said brazing filler metal thereby bonding said tool member shape to said tool holder wherein the polycrystalline diamond layer surface removed from said substrate defines a tool rake face.

15. The method of claim 14, wherein said brazing filler metal is an alloy having a melting point of at least 950° C. and not more than 1300° C.

16. The method of claim 14, wherein said covering layer has a thickness of at least 0.1 μm and not more than 5 μm.

17. The method of claim 14, wherein said covering layer and said brazing filler metal together form a bonding layer having a thickness of at least 10 μm and not more than 50 μm.

18. The method of claim 14, wherein said step (c) comprises melting said substrate in at least one solution selected from the group of hydrochloric acid, sulfuric acid, nitric acid and hydrofluoric acid.

19. The method of claim 14, wherein a cutting edge is formed by laser beam machining on said tool member bonded to said tool holder.

20. A polycrystalline diamond cutting tool comprising a tool holder and a tool member bonded to said tool holder, said tool member comprising a tool material formed by a polycrystalline diamond layer synthesized by low-pressure vapor deposition and having a diamond layer thickness within the range of 0.1 mm to 1.0 mm, said tool member having a rake surface with a surface roughness not more than 0.2 μm maximum height measured as Rmax, said tool material of said tool member having crystal grain sizes within the range of at least 0.01 μm and not more than 1 μm on the side of said tool rake surface and at least 5% and not more than 15% of said diamond layer thickness on a side of a surface bonded to said tool holder, and wherein a portion of said polycrystalline diamond layer up to a depth of 10 μm from said tool rake surface is composed of at least 99 atomic percent and not more than 100 atomic percent of carbon and at least 0 atomic percent and not more than 1 atomic percent of elements other than carbon.

21. The tool of claim 20, wherein said tool material is bonded to said tool holder through a brazing filler metal having a melting point in a range of at last 950° C. and not more than 1300° C.

22. A method of manufacturing a polycrystalline diamond cutting tool having a tool member bonded to a tool holder, said method comprising the following steps:

(a) forming, by low-pressure vapor deposition, a polycrystalline diamond layer on a metal containing substrate said layer comprising a surface in contact with said substrate and an outer growth surface;

(b) removing said substrate from said polycrystalline diamond layer;

(c) performing ion beam machining on substrate contacting surface;

(d) heating said polycrystalline diamond layer in a normal atmosphere at a temperature in a range of at least 300° C. and not more than 500° C.;

(e) forming said polycrystalline diamond layer into a tool member shape;

(f) bonding said tool member shape to said tool holder so that said substrate contacting surface defines a tool rake surface; and (g) forming a cutting edge on said tool member shape while maintaining a surface state of said tool rake surface.

23. The method of claim 22, wherein said low-pressure vapor deposition is continued until said polycrystalline diamond layer has a thickness of at least 0.1 mm and not more than 1.0 mm.

24. The method of claim 22, wherein said bonding is performed by brazing with a filler metal having a melting point in a range of at least 950° C. and not more than 1300° C.

25. The method of claim 22, wherein said substrate contains at least one element selected from the group consisting of Si, Mo and W and wherein a surface of said substrate on which said polycrystalline diamond layer is to be deposited, has a surface roughness of not more than 0.2 μm maximum height measured as Rmax.

26. The method of claim 22 wherein oxygen is an ion source for said ion beam machining.

27. The method of claim 22 wherein said ion beam machining is continued until a portion of said polycrystalline diamond layer has been removed, said removed portion having a thickness within the range of at least 0.02 μm and not more than 2 μm.

28. A method of manufacturing a polycrystalline diamond cutting tool having a tool member bonded to a tool holder, said method comprising the following steps:

(a) forming, by low-pressure vapor deposition, a polycrystalline diamond layer on a metal containing substrate said layer comprising a surface in contact with said substrate and an outer growth surface;

(b) removing said substrate from said polycrystalline diamond layer and forming said layer into a tool member shape;

(c) bonding said tool member shape to said tool holder so that said substrate contacting surface defines a tool rake surface;

(d) performing ion beam machining on said tool rake surface and thereafter heat treating in a normal atmosphere at a temperature in a range of at least 300° C. and not more than 500° C.; and (e) forming a cutting edge on said tool member shape after said ion beam machining and said heat treating while maintaining the surface state of said tool rake surface.

29. The method of claim 28, wherein step (a) is continued until a polycrystalline diamond layer having a thickness of at least 0.1 mm and not more than 1.0 mm has been formed.

30. The method of claim 28, wherein step (c) brazing with a filler metal having a melting point in a range of at least 950° C. and not more than 1300° C.

31. The method of claim 28, wherein said substrate contains at least one element selected from the group consisting of Si, Mo and W, and wherein said substrate has a deposition surface for said polycrystalline diamond layer, said deposition surface having a surface roughness of not more than 0.2 μm maximum height measured as Rmax.

32. The method of claim 28, wherein an ion source for said ion beam machining is oxygen.

33. The method of claim 28, wherein the thickness of said polycrystalline diamond layer removed by said ion beam machining is in a range of at least 0.02 μm and not more than 2 μm.

34. A method of manufacturing a polycrystalline diamond cutting tool having a tool member bonded to a tool holder, said method comprising the following steps:
(a) forming, by low-pressure vapor deposition, a polycrystalline diamond layer on a metal containing substrate said layer comprising a surface in contact with said substrate and an outer growth surface;
(b) removing said substrate from said polycrystalline diamond layer and forming said layer into a tool member shape;
(c) bonding said tool member shape to said tool holder so that said substrate contact surface defines a tool rake surface;
(d) forming a cutting edge on said tool member shape while maintaining the surface state of said tool rake surface;
(e) performing ion beam machining on said tool rake surface; and
(f) heat treating said tool member shape in a normal atmosphere at a temperature in a range of at least 300° C. and, not more than 500 ° C.

35. The method of claim 34, wherein said step (a) is continued until said polycrystalline diamond layer has a thickness of at least 0.1 mm and not more than 1.0 mm.

36. The method of claim 34, wherein said bonding comprises brazing with a filler metal having a melting point in a range of at least 950° C. and not more than 1300° C.

37. The method of claim 34, wherein said substrate contains at least one element selected from Si, Mo and W, and wherein said substrate has a surface having a surface roughness of not more than 0.2 μm maximum height measured as Rmax.

38. The method of claim 34, wherein an ion source for said ion beam machining is oxygen.

39. The method of claim 34, wherein said ion beam machining is continued until a portion of said polycrystalline diamond layer has been removed, said removed portion having a thickness in a range of at least 0.02 μm and not more than 2 μm.

* * * * *

UNITED STATES PATENT AND TRADEMARK OFFICE
CERTIFICATE OF CORRECTION

PATENT NO. : 5,366,522

DATED : November 22, 1994

INVENTOR(S) : Tsutomu Nakamura; Yasuyuki Kanada; Tetsuo Nakai

It is certified that error appears in the above-identified patent and that said Letters Patent is hereby corrected as shown below:

Col. 1, line 15, replace the line to read:
    --BACKGROUND INFORMATION--.

Col. 6, line 13, replace "unpreferable" by --unpreferably--;
    line 26, delete "workpieces";
    line 28, delete "a";
    line 64, after "holder" insert --,--.

Col. 11, line 26, after "Cu" insert --,--.

Col. 13, lines 43 to 45, replace these lines to read:
    --Filament Temperature: 2100°C.
      Filament-to-Substrate Distance: 5mm--.

Col. 16, line 15, delete "an";
    line 54, after "Ti" insert --,--.

UNITED STATES PATENT AND TRADEMARK OFFICE
CERTIFICATE OF CORRECTION

PATENT NO. : 5,366,522

DATED : November 22, 1994

INVENTOR(S) : Tsutomu Nakamura; Yasuyuki Kanada; Tetsuo Nakai

It is certified that error appears in the above-identified patent and that said Letters Patent is hereby corrected as shown below:

Col. 17, line 33, replace "tool" (first occurrence) by --to--;

line 34, after "present" insert --tool--.

Col. 18, line 10, after "Ti" insert --,--;

line 16, replace "tool a," by --tool, a--;

line 34, replace "as-treated" by --treated--;

line 66, delete "no".

Table 7, replace lines 13 and 14 to read as follows:

--Heating Conditions in Atmosphere  380°C 1h.  450°C 3h.  700°C 2h.  480°C 2h.  320°C 3h.  200°C 1h.  340°C 1h.--.

Col. 20, line 17, replace "b" by --$\underline{b}$--;

line 25, replace "b" by --$\underline{b}$--;

line 29, replace "b" by --$\underline{b}$--;

line 34, after "sample" insert --$\underline{a}$--;

line 39, replace "c" by --$\underline{c}$--.

<u>In the Claims</u>:

Claim 1, col. 21, line 17, replace "mental" by --metal--;

UNITED STATES PATENT AND TRADEMARK OFFICE
CERTIFICATE OF CORRECTION

PATENT NO. : 5,366,522

DATED : November 22, 1994

INVENTOR(S) : Tsutomu Nakamura; Yasayuki Kanada; Tetsuo Nakai

It is certified that error appears in the above-identified patent and that said Letters Patent is hereby corrected as shown below:

Claim 9, col. 22, line 30, replace "via" by --VIa--.

Claim 30, col. 25, line 1, after "(c)" insert --comprises--.

Claim 34, col. 26, line 2, replace "contact" by --contacting--.

Signed and Sealed this

Seventh Day of March, 1995

*Attest:*

BRUCE LEHMAN

*Attesting Officer*   Commissioner of Patents and Trademarks